United States Patent
Atkinson

(10) Patent No.: US 7,308,125 B2
(45) Date of Patent: Dec. 11, 2007

(54) METHOD AND APPARATUS FOR REDUCING THE EFFECTS OF MOTION IN AN IMAGE

(75) Inventor: David Atkinson, London (GB)

(73) Assignee: Qinetiq Limited (GB)

( * ) Notice: Subject to any disclaimer, the term of this patent is extended or adjusted under 35 U.S.C. 154(b) by 693 days.

(21) Appl. No.: 10/475,445

(22) PCT Filed: Apr. 18, 2002

(86) PCT No.: PCT/GB02/01731

§ 371 (c)(1),
(2), (4) Date: Oct. 20, 2003

(87) PCT Pub. No.: WO02/086531

PCT Pub. Date: Oct. 31, 2002

(65) Prior Publication Data

US 2004/0114791 A1 Jun. 17, 2004

(30) Foreign Application Priority Data

Apr. 20, 2001 (GB) .................................. 0109892.0

(51) Int. Cl.
G06K 9/00 (2006.01)
(52) U.S. Cl. .................... 382/131; 382/275; 378/21
(58) Field of Classification Search ............... 382/128, 382/129, 130, 131, 132, 133, 103, 168, 216, 382/232, 254, 274, 275–276, 291, 294, 305; 324/307, 306; 600/410; 378/21, 22, 23
See application file for complete search history.

(56) References Cited

U.S. PATENT DOCUMENTS

| 5,850,486 | A | * | 12/1998 | Maas et al. ................. 382/294 |
| 5,928,146 | A | * | 7/1999 | Itagaki et al. ............... 600/410 |
| 5,933,006 | A | * | 8/1999 | Rasche et al. .............. 324/307 |
| 6,076,004 | A | | 6/2000 | Kanayama et al. |
| 6,114,852 | A | * | 9/2000 | Zhou et al. .................. 324/306 |
| 6,341,179 | B1 | * | 1/2002 | Stoyle et al. ............... 382/254 |
| 6,518,759 | B2 | * | 2/2003 | Bernstein .................... 324/307 |

FOREIGN PATENT DOCUMENTS

| WO | WO 98/01828 | 1/1998 |
| WO | WO 00/36549 | 6/2000 |

OTHER PUBLICATIONS

Kassam et al., "3D Registration of fMRI Brain Images Based on K-space Information", *Proceedings of the Society of Magnetic Resonance*, p. 236 (1995).

(Continued)

*Primary Examiner*—Seyed Azarian
(74) *Attorney, Agent, or Firm*—McDonnell Boehnen Hulbert & Berghoff LLP

(57) ABSTRACT

A method and apparatus for reducing the effects of motion of a subject during image acquisition is presented. The method is particularly suitable for correcting the motion during magnetic resonance imaging. The method involves comparing an image with a reference image in the spatial frequency domain to determine the extent of any rotational and/or translational motion and then apply an appropriate correction. Any motion is modeled by comparison with the reference image but the corrected image is produced using information from the corrupted image alone.

21 Claims, 4 Drawing Sheets

OTHER PUBLICATIONS

Calderon, et al., "A Correlation-Based Motion Correction Method for Functional MRI", IEICE Trans. Inf. & System, vol. E81-D, pp. 602-608 (1998).

Calhoun et al., "A Frequency-Space Approach for Motion Correction in functional MRI", *Image and Multidimensional Digital Signal Processing '98 Proceedings*, pp. 12-16 (1998).

Atkinson, "Automatic Motion Correction Using Prior Knowledge", *Proceedings of the International Society for Magnetic Resonance in Medicine*, p. 747 (2001).

Zoroofi, et al. "MRI Artifact Cancellation due to Rigid Motion in the Imaging Plane", *IEEE Transaction on Medical Imaging*, pp. 768-784 (1996).

Eddy, et al., "Improved Image Registration by Using Fourier Interpolation", *Magnetic Resonance in Medicine*, pp. 923-931 (1996).

Aziz, et al., "Magnetic Resonance in Medicine", vol. 34, pp. 476-480 (1995).

Hedley M., et al., "Motion Artifact Correction in MRI using Generalized Projections", *IEEE Trans. Med. Imaging* 0:40-46 (1991).

Reddy BS et al., "An FFT Based Technique for Translation, Rotation and Scale-Invariant Image Registration", IEEE Trans. Imag. Proc. 5:1266-1271 (1996).

* cited by examiner

METHOD AND APPARATUS FOR REDUCING THE EFFECTS OF MOTION IN AN IMAGE

This invention relates to the field of image processing and in particular to image processing techniques whereby artefacts introduced into an image during acquisition, especially through motion of the object being imaged, are corrected for in the generation of an output image.

Magnetic Resonance Imaging (MRI) is a widely used technique for medical diagnostic imaging. In a conventional MRI scanner, a patient is placed in an intense static magnetic field which result in the alignment of the magnetic moments of nuclei with non zero spin quantum numbers either parallel or anti-parallel to the field direction. Boltzmann distribution of moments between the two orientations results in a net magnetisation along the field direction. This magnetisation may be manipulated by applying a radio frequency (RF) magnetic field at a frequency determined by the nuclear species under study and the strength of the applied field. In almost all cases for medical imaging the species studied is the nucleus of the hydrogen atom present in the body mainly in water molecules, and the RF pulses are applied at the resonant frequency of these water protons. However it is also possible to image other nuclear species and hydrogen bound in other species.

The energy absorbed by nuclei from the RF field is subsequently re-emitted and may be detected as an oscillating electrical voltage, or free induction decay signal, in an appropriately tuned antenna. More commonly a further RF pulse or magnetic field gradient is used to postpone signal acquisition and generate a spin-echo or gradient echo-echo signal.

Spatial information is encoded into the echo signal by virtue of additional linearly varying magnetic fields, known as magnetic field gradients, applied during or prior to echo acquisition. The principle of spatial encoding is that in the presence of the field gradient the net field experienced by a given nuclear moment, and hence it resonant frequency, is a function of position with the scanner. When a gradient is applied during echo acquisition the received signal contains a range of frequency components representing nuclei at different locations along the gradient direction. Fourier transformation of this signal yields a one-dimensional projection through the patient. This technique is known as frequency encoding. Two dimensional encoding requires use of an additional gradient, applied perpendicular to the frequency encoding axis, known as the phase encoding gradient. This gradient is applied for a short time prior to data acquisition. The acquisition process is repeated a number of times, perhaps 256 or 512 times, using phase encoding gradients of different strengths. Simultaneous frequency and phase encoding yields a two-dimensional data set which, when subjected to a two-dimensional Fourier transform, provides the required image. This array of data exists in what is known as k-space and is the Fourier transform of the image space. The effect of the phase encoding gradient is to move the start of the data acquisition to a particular location along one axis in k-space (dependent on the gradient strength) whilst frequency encoding represents a sweep through k-space parallel to the other axis. Each of these sweeps in known as a "shot" or "view".

Spatial localisation in the third dimension may be achieved using an additional phase encoding gradient, or more commonly by using a gradient and narrowband RF pulse to restrict the initial perturbation of nuclear moments to a single tomographic slice. This principle can be readily extended to multislice MRI.

In conventional MRI a single phase encoding view is acquired after each RF excitation. However, faster imaging sequences now exist in which further RF pulses and phase encoding gradients are used to acquire a train of differently encoded echoes after each excitation. These echoes traverse several lines of k-space and reduce scanning time by a factor equal to the echo train length. In the extreme case single shot echo planar imaging (EPI) techniques cover the whole of two dimensional k-space in a single acquisition lasting less than 100 ms, although spatial resolution and image quality may be significantly compromised.

Patient movement during the acquisition of MRI images results in degradation of the images that can obscure the clinically relevant information. Each readout period takes a few milliseconds whereas the time interval between readouts might be between 100 and 4000 ms. The majority of blurring and ghosting artefacts caused by patient motion are due to motion between lines in k-space, rather than motion during a single readout.

Movement leads to phase errors between lines of k-space which, in the resulting image, appear as blurring and hosting along the phase encode direction. These phase errors can result from translational movement and rotational movement. Translations of the patient in the readout direction result in a frequency dependent phase shift in each line of k-space. Rotations in the spatial domain are also rotations in k-space and result in k-space changes that are more complicated function of position in k-space.

Various techniques have been employed to correct for image artefacts introduced into an image through motion. However most of the techniques known for correcting for patient motion involve a modified signal acquisition technique which may involve additional scans or even additional equipment.

International Patent Application WO98/01828 discloses a technique for reducing the effect of motion induced artefacts in an image using purely post data gathering signal processing effects. In the technique described therein the data is manipulated to counteract possible movement induced artefacts and the manipulated data compared using a focus condition to see if the image quality is improved. This technique can involve a large amount of processing however. Furthermore the method may involve the grouping of k-space lines to more accurately determine motion parameters, however this grouping can decrease the temporal resolution of the motion found.

Another method of correcting for motion induced image artefacts in the method of Projection onto Complex Sets (POCS) Hedley M, Hong Y and Rosenfeld D. "Motion Artifact Correction in MRI using generalized projections" IEEE Trans. Med. Imag., 10:40-46, 1991. This is a method whereby a good quality image is used to form a binary mask. The mask defines the tissue-air boundary, i.e. outside the mask there should be no signal. Motion induced artefacts in the acquired image cause apparent signal in the air. The POCS method sets all outside the mask in the acquired image to black. The image data is then Fourier transformed to k-space. A new complex k-space is formed from the modulus of the measured data and the phase of the estimation from the previous step. This new k-space is Fourier transformed to the image domain and the process iterates. This method however involves a large amount of Fourier transformation as the process iterates and hence involves a large amount of computational effort and hence time. Further the method requires the spatial alignment of the binary mask with the acquired image before processing which is not always possible to achieve.

A different method of correcting for motion induced artefacts in diffusion-weighted MRI is discussed in 'Correction of Motional Artifacts in Diffusion-Weighted Images Using a Reference Phase Map', Ulug et al. Magnetic Resonance in Medicine, Vol. 34, no. 2, 1995, pp476-480. The method described therein takes a measurement with no diffusion weighting, or a very low weighting, and uses this information to construct a phase map. The phases from this phase map are then used to replace the phases of higher weighted data sets to eliminate a motion induced phase component and form an adjusted data set. Images can then be formed from this motion data set.

The method described by Ulug et al. concerns diffusion-weighted MRI scans, which are very susceptible to motion, and is not applicable to all MRI images. Further the method described would not be capable of correcting for rotations of the object during imaging.

The present invention seeks to provide an alternative method for correcting for motion induced artefacts in an image.

Thus according to the present invention there is provided

A method of producing an image of a scanned object corrected for artefacts introduced by unwanted motion of said object during the scan comprising the steps of:

taking a scan k-space data set derived from the object scan, taking a reference k-space data set of the object, comparing the scan k-space data set and reference k-space data set to determine the extent of any motion during the scan in the scan k-space data set, using the scan k-space data set and information on the extent of motion of the scan k-space data set to produce a motion corrected scan k-space data set, and using the image corrected scan k-space data set to produce an image.

The reference k-space data set is a motion free (or as near to motion free as possible in the circumstances) k-space data set corresponding to an image of the object. By taking a motion free data set the motion leading to the corrupted image data set can be modelled. The data from the scan k-space data set alone is then used to create an image corrected on the basis of the modelled motion. As the two data sets are compared in the k-space or spatial frequency domain there is no need for repeated Fourier transforms of the whole data set. As the method corrects the data of the scan k-space data set for determined motion rather than replace it with other data the information from the actual scan is preserved.

The method preferably comprises the step of dividing the scan k-space and reference k-space data sets into sections in k-space and the step of comparing the scan k-space data set and reference data set compares the data sets section by section to determine the motion. For 2D imaging each section could conveniently be a line of phase encode data taken by the scanner. For 3D imaging each section is a plane of k-space data.

Conveniently the step of comparing the two data sets comprises the step of comparing the data sets to determine the extent of any rotation and also the step or comparing the data sets the extent of any translation. Motion that causes an expansion or contraction in the image might also be corrected by such a method.

Preferably the step of comparing the data sets includes the step of comparing selected points in the data sets to determine the extent of any rotational motion. Conveniently the k-space moduli of selected points can be used for the comparison. The modulus of the k-space data is independent of phase and as such is not affected by translational motion. Rotations of the object being imaged cause rotations in k-space whereas translations impart phase ramps to the k-space data. The selection of the points may involve separating the k-space data into blocks. Certain points within a block could be selected, for instance by selecting the points with the largest modulus value in each block. The separation into blocks ensures that a reasonable coverage of k-space is achieved to give good angular resolution.

The extent of rotational motion can be determined by iteratively considering possible angular motions of the selected points in the reference k-space data and comparing the transformed reference data set with the scan k-space data set using appropriate focus criteria to determine the extent of rotational motion. The step of transforming the reference k-space data set is preferably carried out using linear interpolation although other interpolations such as cubic or spline could be used.

Conveniently the step of comparing the data sets to determine the extent of translational motion are determined using a method based on a cross spectrum method such as described by Reddy B S and Chatterji B N, "An FFT-Based Technique for Translation, Rotation and Scale-Invariant Image Registration" IEEE Trans. Imag. Proc., 5:1266-1271, 1996. In performing the cross spectrum analysis k-space may be zero padded or may be padded with complex values having a modulus equal to one and random phases in order to improve the resolution. The cross-spectrum method detects constant and linearly varying phase differences between the two data sets. The two data sets are combined to form a function $K_c$ as will be described below. The Fourier Transform of $K_c$ gives a peak. The shift of the peak from centre is related to the phase slope and gives an indication of the amount of motion in the FE direction. The phase of the peak reveals any phase difference between the two data sets and reveals the extent of motion in the PE direction.

After determining the extent of translational motion the scan k-space data set may be corrected for the determined motion. The phase of this corrected data set could then be compared to the phase of reference k-space data to determine sub-pixel motion in the frequency encode direction.

Where any point is known to be unreliable in either the reference k-space data set or scan k-space data set the corresponding point in $K_c$ will be unreliable. Such a point could be replaced with a point having a modulus equal to one and random phase to prevent the unreliable point affecting the determination of motion.

The cross-spectrum based method may include a measure of confidence. In the ideal case the result of the Fourier Transform of $K_c$ would be a single peak. In reality differences between the reference and scan k-space data sets due to noise, different acquisition criteria etc. will have an effect. This will result in the FT of $K_c$ being a peak with other values that are non-zero. The ratio of the height of the peak to the average of the other values could be used as a measure of confidence, the higher the ratio the more reliable the determination of motion.

The steps of taking the reference k-space data set and scan k-space data set may include the step of aligning both the scan k-space data set and reference k-space data set so that the maximum (DC) point coincides with the centre of the data grid. Further the method can include the step of globally scaling the two data sets so that at the maximum (DC) point the two data sets have the same complex value.

Note that the k-space point with the maximum modulus value is assumed to be the point that corresponds to zero spatial frequency. Zero spatial frequency is sometimes called DC.

Further the method may include the step of filtering both the acquired image and reference image to introduce a certain amount of blurring. Applying a filter to the images blurs the corresponding k-spaces and can aid the determination of rotational motion using linear interpolation. Blurring the k-space means that it varies less rapidly and so interpolation between points is easier.

The scan k-space data set may be a data set obtained from a magnetic resonance imaging (MRI) scanning means.

The reference k-space data set can be obtained in any number of ways. Many scanning protocols acquire two or more data sets and average in order to provide better to signal to noise ratio. In such cases one of the data sets could be taken as the reference image to correct for any motion in the other(s). The best data set could be determined by using a measure of the entropy of the image, i.e. the degree of disorder in the image.

Alternatively, where the object is being imaged successively in conjunction with introduction of a contrast agent one of the images could be used as the reference k-space data set.

Alternatively the reference k-space data set could be taken from a previously acquired scan. In monitoring of a progressive disorder say there could be a need for repeated scans on the same subjects at different times. As the present invention does not use any k-space information from the reference data set but only determines the extent of any motion for the scan k-space data set a previous image can be used and the technique should be reasonably robust against differences between images such as differing contrast, noise or even features such as an enhancing tumour. Where no reference data is available a reference image could be fabricated from the available data.

Rather than correct a whole image, regions of the image can be masked permitting correction on a localised region only. In this case the method includes the steps of selecting a desired part of the image and blanking the non required areas of the image before Fourier transforming the image to produce the scan k-space data set.

In another aspect of the invention there is provided an imaging system comprising a scanning means for scanning an object and driving a scan k-space data set from signals received from the object and a processing means for manipulating the scan k-space data set to produce an image of the scanned object corrected for artefacts introduced by unwanted motion of said object during the scan wherein the processing means is adapted to take the scan k-space data set derived from the object scan, take a reference k-space data set of the object, compare the scan k-space data set and reference k-space data set to determine the extent of any motion in the scan data set, use the information on the extent of motion of the scan k-space data set to produce a motion corrected scan k-space data set, and use the motion corrected scan k-space data set to produce an image.

The invention will now be described by way of example only with reference to the following drawings of which;

Figure 1:
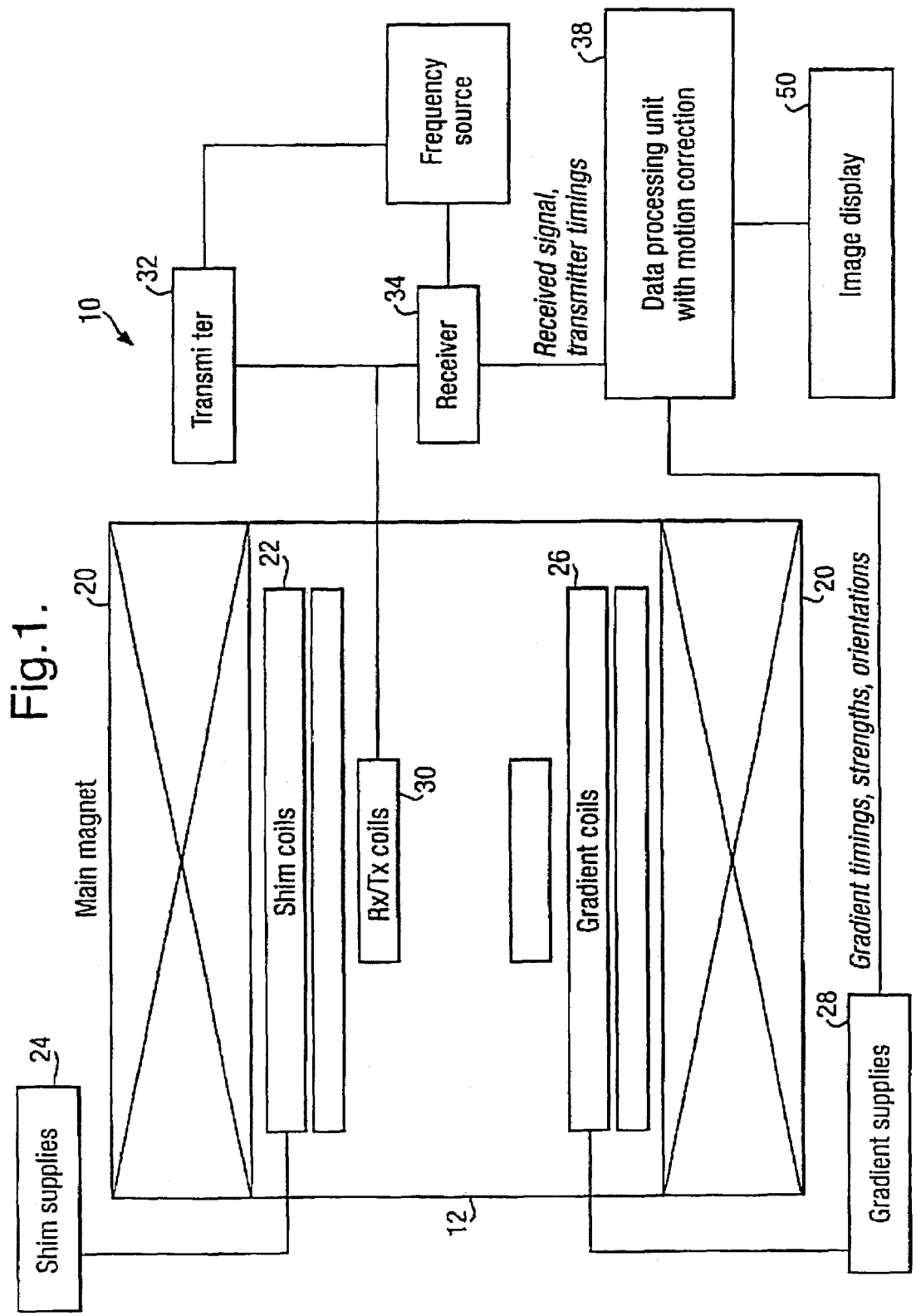
FIG. 1 shows a schematic diagram of a magnetic resonance imaging system.

Referring to FIG. 1 there is shown a schematic diagram of a magnetic resonance imaging system 10. The system 10 incorporates a magnetic resonance imaging scanner 12 of conventional type. The scanner 12 has a superconducting or resistive main magnet 20 which generates a magnetic field sufficiently strong to cause a net alignment along the field direction of atomic nuclei within a patient. The scanner 12 also includes shim coils 22 in order to correct for undesired inhomogeneities in the magnetic field of the main magnet 20. The magnetic field produced by the shim coils 22 is controlled by a shim coil power supply unit 24.

The resonance frequency of particular atomic nuclei is characteristic of the nucleus and the strength of the applied magnetic field. In order to provide spatial information a magnetic field gradient is generated by gradient coils such as coils 26. Gradient coils are often arranged to generate gradient fields in three orthogonal directions. The magnetic fields generated by the gradient coils are controlled by a gradient coil power supply unit 28. In order to generate a signal from the atomic nuclei or the patient a radio-frequency magnetic pulse is generated by transmit coil 30. This pulse 'flips' the angle of the nuclear spins within a certain patient slice of volume. These excited spins or magnetisations then induce a current in the receive coil which may be the same coil as the transmit coil 30. The coil 30 is connected to a transmit unit 32 and a receive unit 34, each of which also receives signals from a frequency source 36.

The system 10 includes a controlling computer 38 which controls the operation of the components of the system 10. The computer 38 controls the gradient coil power supply unit 28 in the form of gradient timing, magnetic field strength and orientation control. In addition, the computer receives signals from the receive unit 34 together with transmitter timings.

In order to form an image of the organs of a patient, the patient is inserted into the system 10 and a series of measurements are taken with different combinations of static and/or varying gradient fields. The signals from the tissue of the patient depend on the tissue's properties, the magnetic field gradient strengths, gradient orientations and timings with respect to the applied radio frequency pulses. The varying gradients code the received signal's phase, frequency and intensity. The received signals as a function of time form an ordered set which is stored in memory in the computer 38 for subsequent processing.

In a subsequent signal processing stage a Fourier transform may be performed on the ordered set of received signals, with the modulus of the transform being used to assign the signals to a grey scale in order to form an image. The set of received signals is said to exist in k-space.

In a conventional MRI if a patient moves during the acquisition of data the received signal is affected and part of the k-space signal is corrupted. Because of the way the image is reconstructed this motion affects the whole image, causing blurring and/or ghosting artefacts in the final image.

Figure 2:
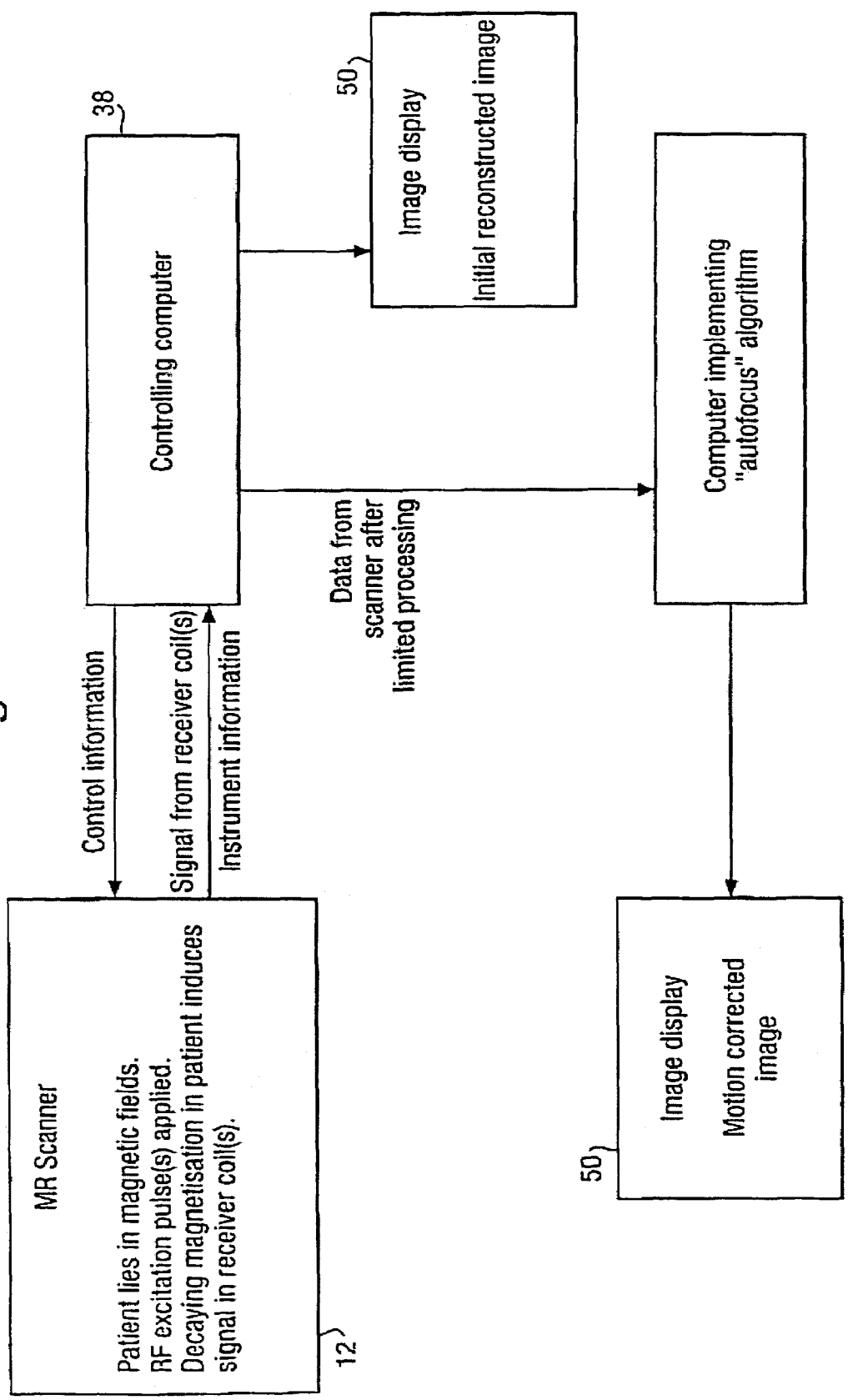
FIG. 2 shows a functional diagram of the operation of the FIG. 1 system.

Referring now to FIG. 2 there is shown a functional block diagram of the operation of the system 10. The computer 38 controls and receives information from the scanner 12 and uses this information to generate an image on display 50. This image is an initial reconstructed image. If an operator of the system 10 considers that the initial image is corrupted an additional signal processing routine is selected. Alternatively the further signal processing could occur automatically. In either case, the stored image data is processed to reduce the effects of the patient's motion.

Figure 3:
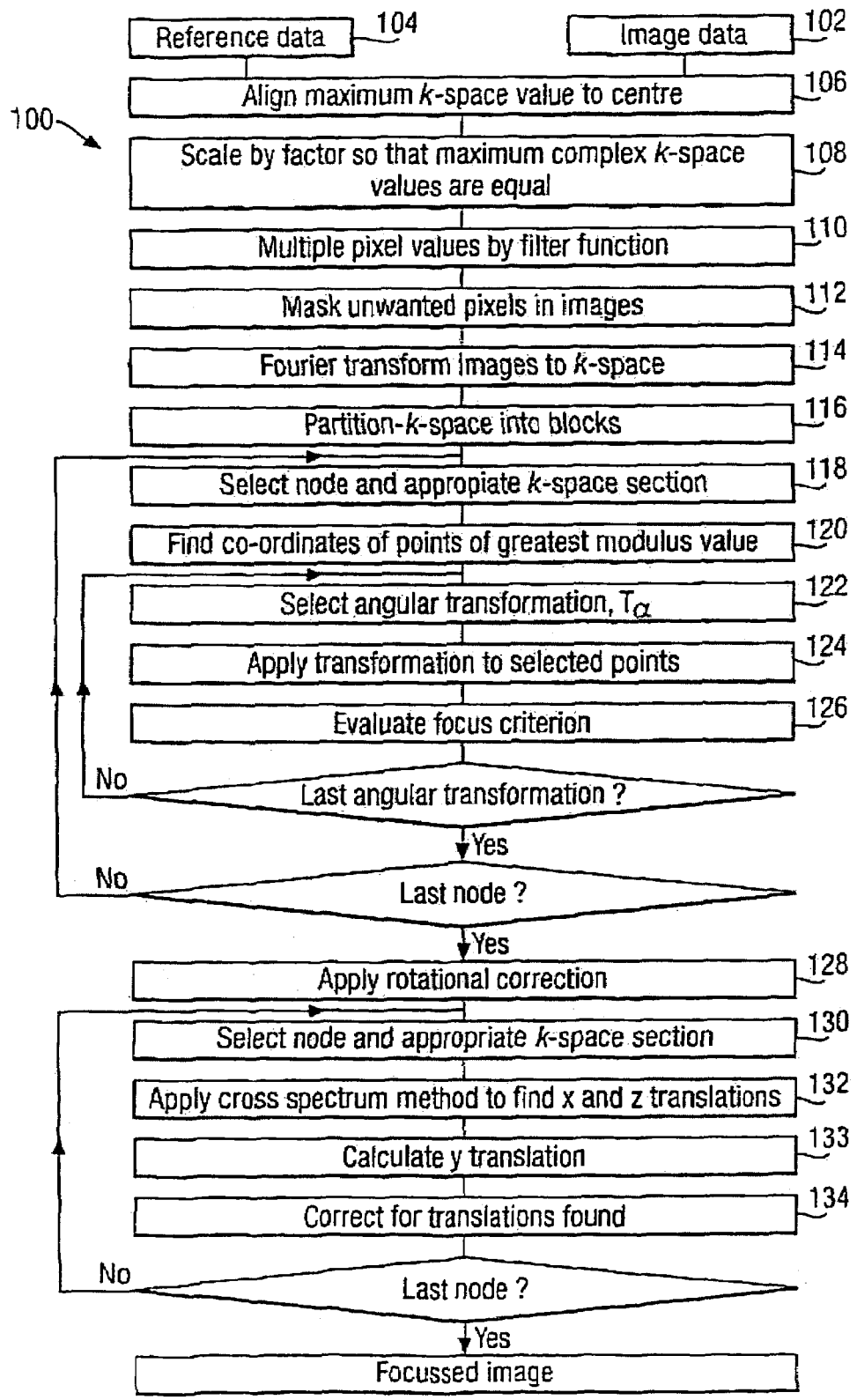
FIG. 3 shows a flow diagram of an image correction routine performed according to the present invention.

The method of processing the image is as follows with reference to FIG. 3 which shows a flow chart 100 of the stages in an image processing routine according to the present invention.

The acquisition time is divided into nodes. For 2D images a node corresponds to a phase encode line. For 3D images a node is a plane of k-space data.

The axes of the system are defined as follows: X is the readout, or frequency encode direction. For 2D imaging Y is the phase encode gradient direction and Z is the through slice direction. In 3D imaging Y is the slow phase gradient encode direction and Z is the fast phase encode gradient direction. Therefore data points are acquired with $k_x$ varying most rapidly, then $k_z$ and most slowly in $k_y$. In 3D imaging a node is a plane of constant $k_y$.

The image processing is carried out on image data 102, which may be obtained, for instance, as sequential k-space lines although other acquisition techniques are possible. A reference image data set 104 is also used.

Initially a degree of pre-processing of the data sets may be performed to aid in the comparison. In this case the first stage may be an alignment stage 106 where both k-spaces are aligned such that the maximum (DC) value k-space data point for each set is at the centre pixel for both data sets.

The two data sets may then be scaled in a normalisation stage 108 to ensure that the complex value at DC is the same in each data set. This is preferably done on the reference data set 104.

A filtering stage 110 is then employed to filter the actual image and the reference image. This filter introduces a degree of blurring into the k-space which aids in the comparison stages later. A suitable filtering function is to multiply the pixels by a Gaussian with value 1 at the image centre falling away towards the image edge. One filter that has been used is a Gaussian with a variance equal to $(0.3125 \text{ n})^2$ where n is the number of points along that k-space dimension.

By filtering in such a manner k-space is blurred (and the image is bright in the middle and gets darker towards the edges). This aids the linear interpolation step later.

If required a masking stage 112 can be applied where pixels not of interest can be set to zero.

The filtered and suitably masked images then undergo a Fourier transform stage 114 to produce the k-space image data set and k-space reference data set. The filtering and masking is performed on the actual image hence the need to Fourier transform into k-space.

In order to ensure that appropriate angular resolution is achieved k-space is then partitioned into various blocks in a partitioning stage 116. Splitting k-space into blocks can enable an increase in speed of the algorithm but can result in a loss of accuracy and this partitioning can be omitted by making every k-space point a separate block. For a 2D image there may be a number of blocks spaced evenly along the line. If there were 256 points in a line choosing 32 blocks would result in 8 points per block although other combinations could be used. In 3D the plane is divided into a certain number of blocks in each dimension of the plane.

Next, at the node selection stage 118 each node is selected in turn. For each node the coordinates, $r_i$ of the points with the largest modulus value in each block are determined in stage 120 although other selection criteria could be utilized.

An angular transformation $T_a$ corresponding to a rotation of interest is selected, different transformation being selected in turn in a selection stage 122. The modulus of the positions in the reference k-space $K_r$ corresponding to the coordinates of the selected points transformed by the angular transformation $T_a$ are then determined. In this stage 124 linear interpolation techniques, as will be well understood to one skilled in the art, are sufficient when the filtering stage 110 has been applied.

The angular transformation $T_a$ that most accurately represents the rotational motion can be determined by finding which angular transformation minimises a suitable focus criteria.

A suitable focus criteria is;

$$f_c = \sum_i \frac{(|K_r(T_a(r_i))| - |K_m(r_i)|)^2}{|K_r(T_a(r_i))|^2 - |K_m(r_i)|^2}$$

where $K_m(r_i)$ is the unmodified image data for the selected positions. When $T_a(r_i)$ falls outside the measured reference k-space it should be excluded from the focus criteria sum.

This focus criteria is suitable for nodes close to the central (C) node. For nodes further away say more than 60 nodes from the central (DC) node the focus criteria sum can be changed so that the numerators and denominators are summed separately before taking the ratio. The normalisation of the focus criterion can be changed to alter the relative contribution from k-space points with different modulus values. Near the centre where the moduli are larger than the edges each point carries the same weight which gives the best angular resolution. For the outer lines however, which have lower moduli, noise is more of a problem and changing the normalisation permits a trade off between noise and angular resolution.

As an alternative, instead of interpolating points within one data set the relevant line from a previously rotated and stored data set might be used in the evaluation of the focus criterion.

Once all the angular transformations have been checked and the minimum focus criteria determined for that node the next node can be tried.

Once all nodes have been processed a rotation correcting stage is undertaken where, for instance, a shearing algorithm is applied, as is well known, to apply the rotations found to the k-space data set. Other methods for correcting such as interpolation could also be applied however.

Next the translations are corrected starting with again with a node choice step 130. In an alternative embodiment however the translational correction for a particular node could be determined immediately after a rotational correction for a node has been performed. It is not necessary to wait for all nodes to undergo rotational correction The translations are determined using a cross spectrum based method. If $K_r$ represents all the k-space points in a line (or a plane in 3D) of the reference data at a given node and $K_m$ the same in the image data then the position of the peak in the Fourier transform of $K_c$ gives the translation in the defined x-direction (and z in 3D). $K_c$ is given by the equation;

$$K_c = \frac{K_r^* K_m}{|K_r||K_m|}$$

The shift of the peak of the Fourier transform of $K_c$ from the centre of the array gives the x and z directions (just x in 2D) and the y-direction can be determined from the phase p of the peak. The y displacement Y is given by;

$$Y = \frac{p}{2\pi l}$$

where l is the number of the phase encode line, being 0 at the centre (DC) phase encode line.

To improve the resolution by which x and z displacements are found, $K_c$ may be zero padded. Alternatively, $K_c$ may be padded with complex values that have modulus one and random phases. The latter may enable the peak in the Fourier transform of $K_c$ to be more clearly distinguished and accurately located.

Further if any points in either $K_r$ or $K_m$ are known to be unreliable, the corresponding point in $K_c$ will also be unreliable. In such a case the unreliable point could be replaced with a point having modulus one and random phase. A modulus of one is chosen as every point of $K_c$ will have a modulus of one due to the inherent normalisation present in $K_c$. A point may be determined as unreliable by some other processing step such as data averaging or calculation of k-space from multiple receiver coils.

The translation information can then be used in a correction stage 134 to correct the data for that node before moving onto the next node.

Where the cross-spectrum based method as described above is used without data padding the method determines the translational motion in the frequency encode direction correct to the nearest pixel. In an alternative embodiment (not shown) the method can be run as described above using the reference data set and the image data set. The image data set can then be corrected for the determined motion and this intermediate corrected data then compared with the reference data set. The remaining phase ramp can then be determined to give sub-pixel shifts in the fe direction. The phase ramp may be determined using a robust line fitting algorithm on the phase of the ratio of the $K_r$ to corrected $K_m$.

In this way the acquired image may be compared to the reference image and any rotational and/or translational movement of the acquired image can be corrected. Carrying out the rotational comparison on the k-space modulus data has the advantage of being invariant to any translational motion. Also the centre of rotation in the image domain does not need to be known as k-space always rotates about its centre.

A consequence of this method is that the reference and corrected image are spatially aligned. Further no prior spatial alignment of the reference and data image sets is required unlike the method Projection onto Convex Sets.

Also although all the information in the reference image is used to inform the motion correction required for the image data all of the actual data points used in the corrected image come from the image data.

The reference image could be a previously acquired scan. Some patients with progressive disorders have several scans and a historical scan could be used. As none of the actual reference image data is used in the corrected image the method can be used with slight differences between the images such as might be encountered between scans at different stages of a slowly progressing disorder.

Alternatively where multiple images are taken, for instance with increasing contrast agent a particular image could be taken as the reference image. Further some imaging techniques take two images and average to achieve better signal to noise ratio. In either of these instances the best image in terms of freedom from motion induced image artefacts may be used. This could be chosen by a system operator or alternatively the best image could be chosen by suitable image processing techniques. For instance an entropy based calculation could be conducted on the image to measure the amount of disorder of the image, the image with the lower entropy having more order and less artefacts. The skilled person would be well versed in suitable entropy calculation techniques.

Where no reference data is available a reference image could be fabricated from the available data.

Figure 4:
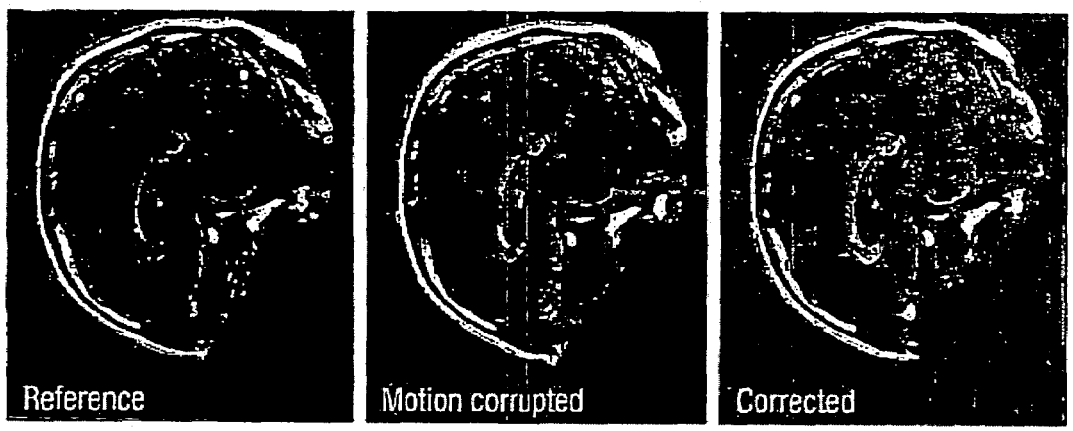
FIG. 4 shows an MRI image, a reference image and a motion corrected image using the method of the present invention.

FIG. 4 shows a 2D slice of a subject. An image of the stationary subject is shown on the left. This image was used as the reference image. A motion corrupted image was taken as shown in the centre (the subject nodded during a scan). Using the method of the present invention a corrected image was obtained as shown. It can be seen that the corrected image is significantly improved over the motion corrupted image.

Figure 5:
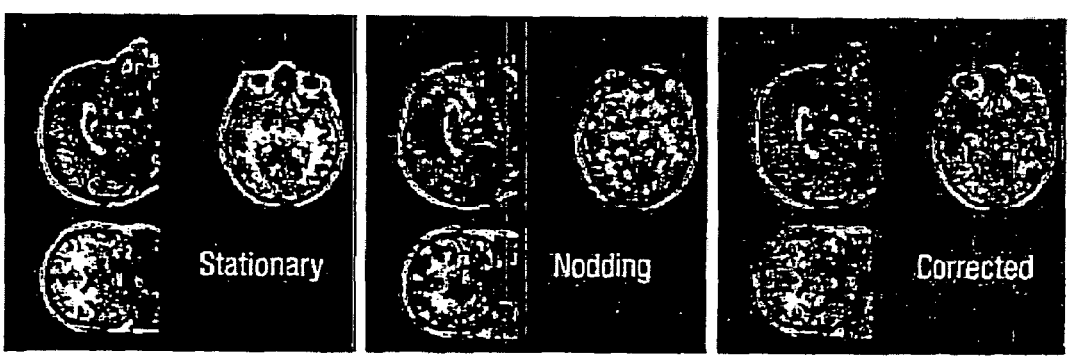
FIG. 5 shows orthogonal MRI images for an acquired image, a reference image and a motion corrected image using the present invention.

FIG. 5 shows three orthogonal slices through a subject. Again a reference image is shown on the left, a motion corrupted image shown in the centre and an image corrected according to the present invention shown on the right. Again an improvement can be seen in the corrected image In a further embodiment the cross-spectrum based method described above can be used to give an indication of confidence with which the motions have been determined. Under ideal conditions, where the reference data set and image data set differ only due to translational motion, the Fourier Transform of $K_c$ is a peak with all other values zero. In practice both data sets will be different due to noise and because they are acquired at different times and possibly under different conditions. Therefore in practice the Fourier Transform will result in a peak with other values that are non-zero. The ratio of the height of the peak to the average of the other values can be used as a measure of reliability, the higher the ratio the more reliable the motion determined. This could be used to simply give an indication of confidence in motion determination or could be used to indicate that a different reference data set should be tried. The method could automatically determine the ratio and produce a signal if the ratio fell below a certain threshold.

Other embodiments and advantages of the invention will be apparent to the skilled person without departing from the invention described herein.

The invention claimed is:

1. A method of producing an image of scanned object corrected for artefacts introduced by unwanted motion of said object during the scan of comprising the steps of;

taking a scan κ-space data set derived from the object scan, taking a reference κ-space data set of the object, comparing the scan κ-space data set and reference κ-space data set to determine the extent of any motion occurring during the scan in the scan κ-space data set, using the scan κ-space data set and information on the extent of motion of the scan κ-space data set to produce a motion corrected scan κ-space data set, and using the corrected scan κ-space data set to produce an image.

2. A method according to claim 1 wherein the method includes the steps of dividing the scan κ-space data set and reference κ-space data set into sections and wherein the step of comparing the scan κ-space data set and reference κ-space data set comprises the step of comparing the scan κ-space data set and reference κ-space data set section by section to determine the extent of motion of the scan κ-space data set.

3. A method as claimed in claim 2 wherein each section of the scan κ-space data set is a line of phase encode data.

4. A method as claimed in claim 2 wherein each section of the scan κ-space data set is a plane of κ-space data.

5. A method as claimed in claim 1 wherein the method comprises a step of comparing scan κ-space data set and reference κ-space data set to determine the extent of any rotation and separately comparing the scan κ-space data set and reference κ-space data set to determine the extent of any translation.

6. A method that is claimed in claim 1 wherein the method includes the step of comparing the moduli of selected points in the scan κ-space data set and reference κ-space data set to determine the extent of rotational motion.

7. A method according to claim 6 wherein the selected points are the points with the largest modulus value in selected blocks of κ-space.

8. A method according to claim 6 wherein the step of comparing the moduli of selected points comprises the steps of iteratively transforming the selected points in either the reference κ-space data set or scan κ-space data set with various possible rotational transformations and comparing with the other κ-space data set.

9. A method according to claim 8 wherein the transformation is carried out using linear interpolation.

10. A method according to claim 1 wherein a cross spectrum based method is used to compare the scan κ-space data set and reference κ-space data set to determine the extent of translational motion.

11. A method according to claim 10 wherein the cross-spectrum based method involves the step of combining the reference κ-space data set and scan κ-space data set to form a combined κ-space data set, performing a Fourier transform of the combined κ-space data set and determining the position and phase of the peak of the Fourier Transformed combined κ-space data set to determine the extent of translational motion.

12. A method as claimed in claim 11 wherein, following the Fourier Transform of the combined κ-space data set, the ratio of the peak amplitude to average amplitude of the rest of values is determined.

13. A method according to claim 10 wherein in performing the cross spectrum analysis κ-space is padded with complex values having a modulus equal to one and random phases.

14. A method according to claim 10 wherein the method includes the step of correcting the scan κ-space data set for the determined translational motion and comparing the phase of the motion corrected scan κ-space data set with the phase of the reference κ-space data set to determine sub-pixel motions.

15. A method according to claim 10 wherein in performing the cross spectrum analysis any data point known to be unreliable is replaced with a data point having a modulus equal to one and random phase.

16. A method according to claim 1 wherein the method includes an initial step of aligning both the scan κ-space data set and the reference κ-space data set so that the maximum (DC) point coincides with the centre of the data grid.

17. A method according to claim 1 wherein the method includes an initial step of globally scaling the two κ-space data sets so at the maximum (DC) point the two κ-space data sets have the same complex values.

18. A method according to claim 1 wherein the images represented by the reference κ-space data set and scan κ-space data set are filtered to introduce a blur into the κ-spaces before comparison of the κ-space data sets.

19. A method according to claim 1 wherein the scan κ-space data set is obtained from a magnetic resonance imaging scanning means.

20. A method according to claim 1 wherein parts of the image represented by the scan κ-space data set is masked before comparison.

21. An imaging system comprising a scanning means for scarming an object and deriving a scan κ-space data set from signals received from the object and a processing means for manipulating the scan κ-space data set to produce an image of the scanned object corrected for artefacts introduced by unwanted motion of said object during the scan wherein the processing means is adapted to take the scan κ-space data set derived from the object scan, take a κ-space reference data set of the object, compare the scan κ-space data set and reference κ-space data set to determine the extent of any motion in the scan κ-space data set, use the information on the extent of motion of the scan κ-space data set to produce a motion corrected scan κ-space data set, and use the motion corrected scan κ-space data set to produce an image.

* * * * *